United States Patent [19]

Asai et al.

[11] 4,449,107

[45] May 15, 1984

[54] SURFACE ELASTIC WAVE ELEMENT

[75] Inventors: Ryuichi Asai; Takeshi Okamoto; Shoichi Minagawa, all of Tokyo, Japan

[73] Assignee: Clarion Co., Ltd., Tokyo, Japan

[21] Appl. No.: 354,430

[22] Filed: Mar. 3, 1982

[30] Foreign Application Priority Data

| Mar. 5, 1981 | [JP] | Japan | 56-31562 |
| Sep. 7, 1981 | [JP] | Japan | 56-139724 |
| Sep. 30, 1981 | [JP] | Japan | 56-153826 |
| Sep. 30, 1981 | [JP] | Japan | 56-153825 |
| Sep. 30, 1981 | [JP] | Japan | 56-153827 |
| Oct. 9, 1981 | [JP] | Japan | 56-160062 |
| Oct. 12, 1981 | [JP] | Japan | 56-163148 |

[51] Int. Cl.³ .................. H03H 9/145; H03H 9/25; H03H 9/42

[52] U.S. Cl. .................. 333/150; 310/313 A; 333/154; 333/193

[58] Field of Search ............. 333/150-155, 333/141, 147, 193-196; 310/313 R, 313 A, 313 B, 313 C, 313 D; 29/25.35

[56] References Cited

U.S. PATENT DOCUMENTS

| 3,786,373 | 1/1974 | Schulz et al. | 310/313 A |
| 3,828,283 | 8/1974 | Daniel | 310/313 A |
| 4,037,176 | 7/1977 | Ono et al. | 310/313 B |
| 4,038,615 | 7/1977 | Ishiyama et al. | 333/154 X |
| 4,194,171 | 3/1980 | Jelks | 333/149 |
| 4,354,130 | 10/1982 | Ono et al. | 333/154 X |
| 4,358,745 | 11/1982 | Keyes | 333/155 |

Primary Examiner—Marvin L. Nussbaum
Attorney, Agent, or Firm—Thiel, Boutell & Tanis Flynn

[57] ABSTRACT

A surface elastic wave element comprising a (110)-oriented silicon substrate, a zinc oxide layer formed on the silicon substrate and electrodes formed on the zinc oxide layer so as to propagate surface elastic wave to the [001]-axis direction of the zinc oxide layer.

14 Claims, 43 Drawing Figures

THICKNESS OF ZINC-OXIDE LAYER

THICKNESS OF ZINC-OXIDE LAYER

THICKNESS OF ZINC-OXIDE LAYER

THICKNESS OF ZINC-OXIDE LAYER

THICKNESS OF ZINC-OXIDE LAYER

THICKNESS OF ZINC-OXIDE LAYER

THICKNESS OF ZINC-OXIDE LAYER

THICKNESS OF ZINC-OXIDE LAYER ($2\pi h/\lambda$)

THICKNESS OF ZINC-OXIDE LAYER

SURFACE ELASTIC WAVE ELEMENT

BACKGROUND OF THE INVENTION

This invention relates to a surface elastic wave element having a structure operable with high efficiency.

Recently, there have widely been developed various surface elastic wave (SEW) elements utilizing surface elastic wave which propagates along the surface of an elastic material. These have been developed because (1) surface elastic wave is a surge propagating closely along the surface of a material, (2) its propagating speed is about $10^{-5}$ times of the speed of the electromagnetic wave to allow miniaturization and high concentration of the element and (3) it is expected to realize a new element combined with IC.

FIG. 1 shows an example of conventional surface elastic wave elements in which the reference numeral 1 designates a piezoelectric single crystalline substrate made of LiNbO$_3$ and 2 and 3 denote comb electrodes provided on the substrate 1, one of the electrodes, 2, for example, serving as an input electrode while the other electrode 3 serves as an output electrode. Surface elastic wave excited through the input electrode 2 propagates along the LiNbO$_3$ piezoelectric single crystalline substrate 1 and is taken out of the output electrode 3.

The surface elastic wave element with this arrangement, due to high electromechanical coupling coefficient K, when adopted in filters, etc. having comb electrodes, has various advantages like realization of wideband characteristic, easy matching, reduction of insertion loss, reduction of the number of teeth of the comb electrodes, miniaturization of the element resulting in reduction of production cost. However, such structure of the substrate made from the single material LiNbO$_3$ has a drawback that the propagation speed and the electromechanical coupling coefficient of the element is substantially fixed in accordance with the direction of crystalline alignment of the surface of the substrate and the progagating direction of the surface elastic wave determined by the crystalline alignment direction.

In order to eliminate the drawback and endow the characteristics with flexibility, there has been proposed a zinc oxide/silicon element, for example. However, the electromechanical coupling coefficient K cannot be improved even by such element as compared with the LiNbO$_3$ single crystalline substrate.

OBJECT OF THE INVENTION

It is therefore an object of the present invention to solve the above-mentioned conventional problems.

To this end, the present invention provides a surface elastic wave element wherein piezoelectric layer comprising zinc oxide layer is formed on silicon plate, as a substrate material, which is cut down by a surface parallel to the (110)-surface ((110)-oriented silicon) or other surfaces and dielectric layer is interposed between the silicon plate and the piezoelectric layer if necessary.

SUMMARY OF THE INVENTION

In accordance with the present invention there is provided a surface elastic wave (SEW) element which comprises:
a (110)-oriented silicon substrate:
a zinc oxide layer grown on said substrate; and electrodes formed on said zinc oxide layer.

DETAILED DESCRIPTION OF THE PREFERRED EMBODIMENTS

Figure 1:
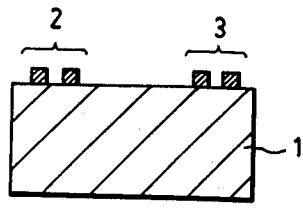
FIG. 1 shows a sectional view illustrating a conventional element.
Figure 2:
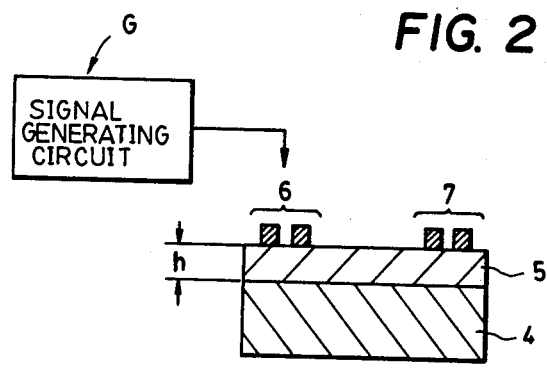
FIG. 2 and FIG. 3 show sectional views illustrating embodiments according to the present invention.

The present invention will now be described in detail referring to the preferred embodiments illustrated in the drawings. FIG. 2 shows a sectional view illustrating an embodiment of a SEW element according to the present invention wherein the reference numeral 4 designates a (110)-oriented silicon substrate, the numeral 5 is a zinc oxide layer so formed that a piezoelectric axis formed thereof is positioned vertically of the surface of the silicon substrate 4 and the numerals 6 and 7 are comb electrodes provided on the surface of the zinc oxide layer 5.

Figure 3:
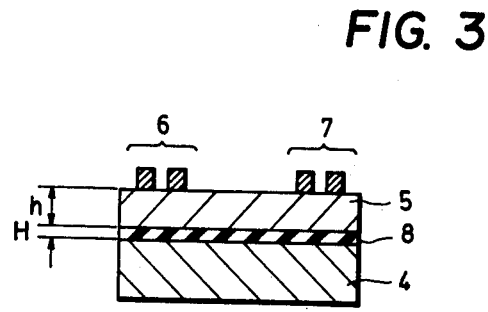

FIG. 3 shows another embodiment according to the present invention wherein the reference numeral 8 denotes a dielectric layer made of a silicon dioxide layer, for example, and interposed between the silicon substrate 4 and the zinc oxide layer 5. The silicon dioxide layer may be grown by providing the silicon substrate 4 with heat treatment in oxidation atmosphere.

The SEW elements as shown in FIGS. 2 and 3 are manufactured in the following process.

First, the (110)-oriented silicon substrate is prepared. The zinc oxide layer 5 with 6.8 μm thickness and c axis orientation is then formed on the silicon substrate 4 by the RF sputtering method. In case of the embodiment as shown in FIG. 3, a dielectric layer 8 made with silicon dioxide is previously formed on the silicon substrate 4 by the heat treatment as described above. Next, an aluminum layer is formed throughout the zinc oxide layer 5 by the DC sputtering method and sequentially partially removed by photo etching method so as to form comb electrodes 6 and 7 of which the electrode 6 is used as an imput electrode while the other electrode 7 serves as an output electrode. In this case, each tooth of the comb electrodes is about 6 μm wide and the electrode pitch is about 24 μm.

The input electrode 6 of the surface elastic wave element manufactured in the above-mentioned process is provided with a signal which generates Sezawa wave as a surface elastic wave propagating from an appropriate signal generating circuit G (not shown in the following embodiments), for example, to the [001]-axis direction of the zinc oxide layer 5 and excited by the signal. Accordingly, the surface elastic wave propagates along the surface of the zinc oxide layer 5 to reach the output electrode 7.

Figure 4:
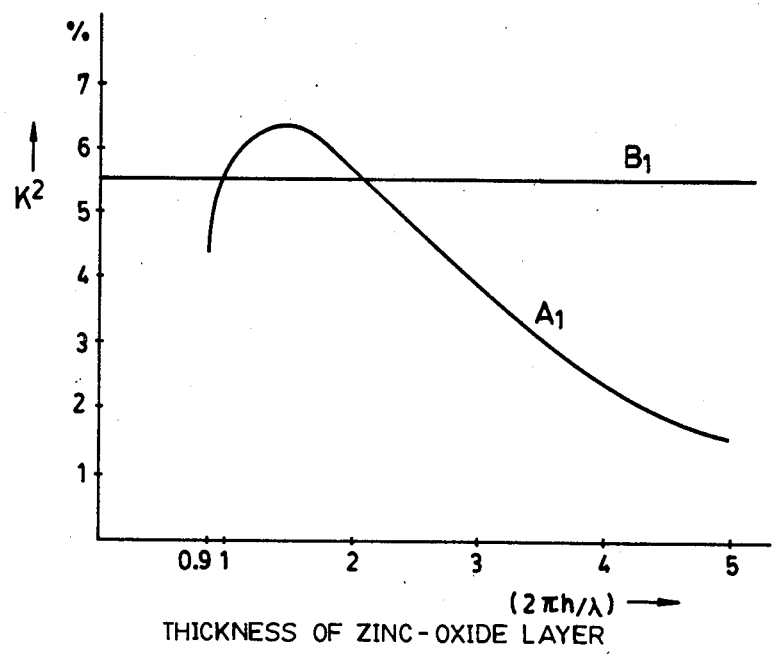
FIG. 4 shows a characteristic diagram of the embodiments as shown in FIGS. 2 and 3.

FIG. 4 shows the characteristics of the element according to the embodiments as shown in FIGS. 2 and 3, wherein the abscissa represents the value obtained by substituting the standardized thickness h in the formula $2\pi h/\lambda$ ($\lambda$=wavelength of SEW) while the ordinate represents the square value $K^2$ of the electromechanical coupling coefficient K in percentage. When the electric conductivity at the boundary between the silicon substrate 4 and the zinc oxide layer 5 is high in the structure as shown in FIG. 2 and when the electric conductivity on the surface of the silicon substrate 4 is high and the thickness H of the dielectric layer 8 is smaller than the thickness h of the zinc oxide layer 5 in the structure as shown in FIG. 3, the characteristics vary as shown by the curve $A_1$ in FIG. 4. Incidentally, the curve $A_1$ is that of Sezawa wave among surface elastic waves. The straight line $B_1$ shows the $K^2$ characteristics obtained when using a $LiNbO_3$ substrate to reach the maximum value of 5.5%.

As apparent from the characteristic as shown in FIG. 4, if the surface elastic wave is allowed to propagate to the [001]-axis direction on the surface of the zinc oxide layer 5, electromechanical coupling coefficient large enough to realize high efficiency of the element can be obtained by determining the thickness h of the zinc oxide layer 5 to satisfy the relation $0.9 < 2\pi h/\lambda < 3.0$. For example, when the abscissa $2\pi h/\lambda$ was selected to be 1.78, $K^2$ amounting to 6% was obtained. This value is substantially equal to the theoretical value.

The electromechanical coupling coefficient K may be determined as desired by varying the thickness h of the zinc oxide layer 5, the orientation of the silicon substrate 4, the propagating axis for the surface elastic wave, and others.

The dielectric layer 8 interposed between the silicon substrate 4 and the zinc oxide layer 5 serves to stabilize the superficial characteristics of the silicon substrate 4, thus being effective in realizing stable function of the element.

Figure 7:
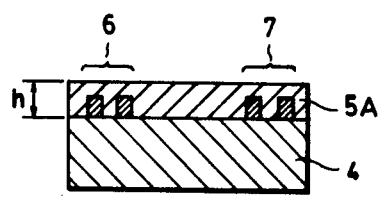
FIG. 7, FIG. 9 and FIG. 10 show sectional views illustrating further embodiments according to the present invention.

FIG. 7 shows a sectional view illustrating another embodiment of the SEW element according to the present invention, wherein the same numerals FIG. 2 designate the same or similar parts. The numeral 5A refers to a zinc oxide layer so formed to entirely cover the input and output comb electrodes 6 and 7 formed on the silicon substrate 4 and that the piezoelectric axis thereof extends perpendicularly to the surface of the silicon substrate 4.

Figure 8:
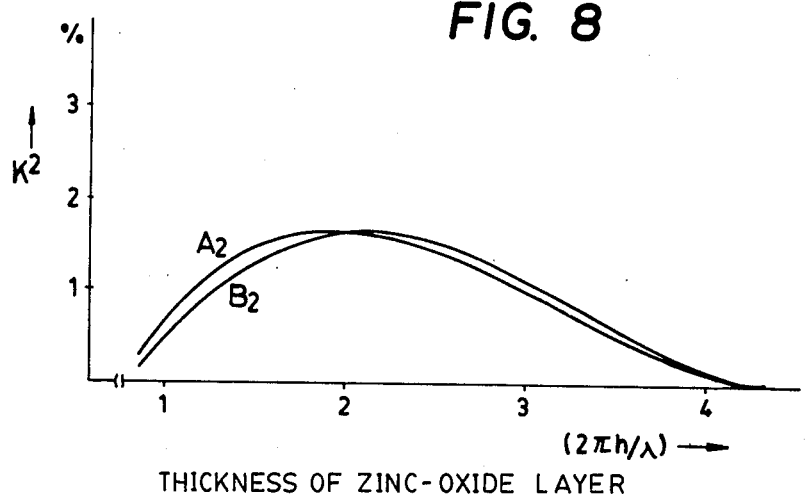
FIG. 8 and FIG. 11 show characteristic diagrams of the embodiments as shown in FIGS. 7, 9 and 10.

FIG. 8 shows characteristics obtained by the embodiment as shown in FIG. 7. The value of $K^2$ varies as shown by the curve $A_2$ in response to the variation of the thickness h of the zinc oxide layer 5A. This curve $A_2$ also relates to Sezawa wave.

The curve $B_2$ shows the $K^2$ characteristics obtained when Sezawa wave is excited to the [001]-axis direction of the silicon using a (100)-oriented silicon substrate.

As apparent from the characteristics as shown in FIG. 8, when propagating the surface elastic wave to the [001]-axis direction of the silicon, electromechanical coupling coefficient large enough to realize high efficiency of the element can be obtained by determining the thickness h of the zinc oxide layer 5A to satisfy the expression $1.2 < 2\pi h/\lambda < 3.0$.

Figure 9:
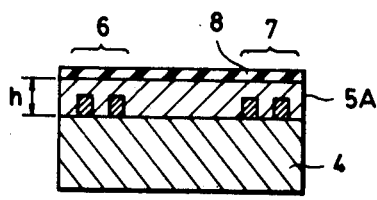

FIG. 9 shows a further embodiment according to the present invention wherein there is provided a dielectric layer 8 of silicon dioxide, for example, on the surface of the zinc oxide layer 5A.

Figure 10:
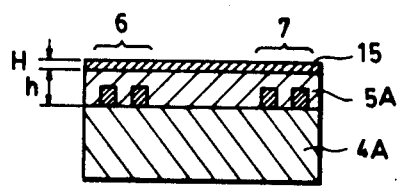

FIG. 10 shows a sectional view illustrating a further embodiment of the SEW element according to the present invention wherein a metallic layer 15 is formed on the zinc oxide layer 5A.

Figure 11:
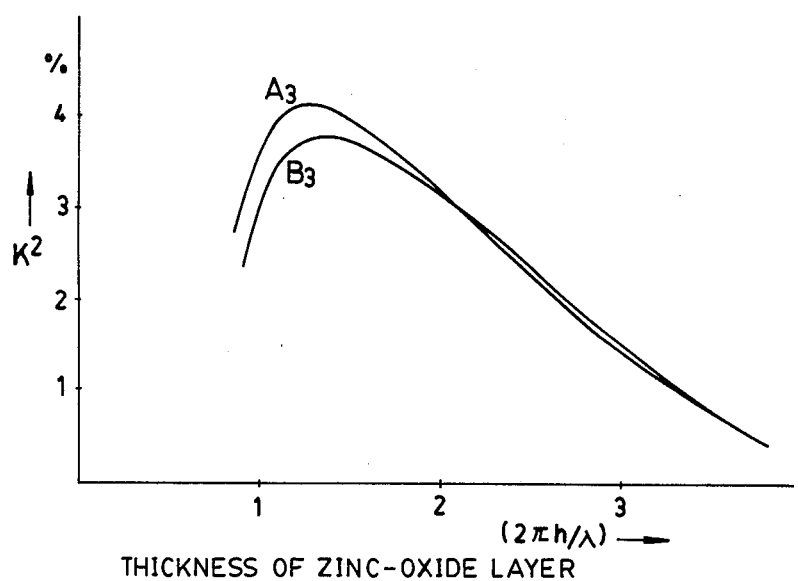

When exciting Sezawa wave, kind of surface elastic wave, to the [001]-axis direction of the silicon through the input electrode 6 of the SEW element as constructed above, the characteristics as shown in FIG. 11 were obtained. When the thickness H of the metallic layer 15 in FIG. 10 is sufficiently small as compared with the wavelength of the surface elastic wave, the value of $K^2$ varies as shown by the curve $A_3$ in response to the variation of the thickness h of the zinc oxide layer 5A. The curve $A_3$ also relates to Sezawa wave, kind of surface elastic wave.

The curve $B_3$ shows the $K^2$ characteristics obtained when using the (100)-oriented silicon substrate and exciting Sezawa wave to the [001]-axis direction of the silicon.

As apparent from the characteristic as shown in FIG. 11, when propagating the surface elastic wave to the [001]-axis direction of the silicon, electromechanical coupling coefficient large enough to realize high efficiency of the element can be obtained by determining the thickness h of the zinc oxide layer 5A to satisfy the relation $1.0 < 2\pi h/\lambda < 2.6$.

The metallic layer 15 need not cover throughout the zinc oxide layer 5A only if it covers at least the portions just above the intersecting depth of the comb electrodes 6 and 7 with each other.

With this arrangement, the electromechanical coupling coefficient K can be determined as desired by varying the thickness h of the zinc oxide layer 5A, orientation of the silicon substrate 4, propagation axis of the surface elastic wave, etc.

Figure 12:
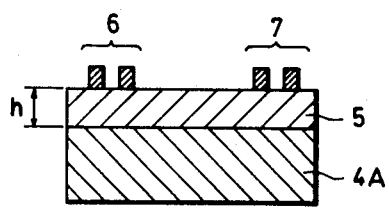
FIGS. 12, 14, 16, 18, 20, 22 and 23 show sectional views illustrating further embodiments according to the present invention.

FIG. 12 shows a sectional view illustrating an embodiment of the SEW element according to the present invention wherein the same reference numerals as those in FIG. 2 denote the same or similar parts. The numeral 4A designates a (100)-oriented silicon substrate.

This element is manufactured in the following process.

The (100)-oriented silicon substrate 4A is prepared and the zinc oxide layer 5 which is 4–11 μm thick and c axis-oriented is grown on the silicon substrate 4A by the RF sputtering method. An aluminum layer is grown throughout the zinc oxide layer 5 by the DC sputtering method and thereafter partially removed to form comb electrodes 6 and 7 of which the electrode 6 is used as the input electrode while the other electrode 7 serves as the output electrode. In this case, each tooth of the electrodes 6 and 7 is 3–9 μm wide and the electrode pitch is 12–38 μ.

Through the input electrode 6 of the SEW element as constructed above, Sezawa wave, kind of surface elastic waves, is excited to the [011]-axis direction of the silicon. Accordingly, the surface elastic wave propagates along the surface of the zinc oxide layer 5 to reach the output electrode 7.

Figure 13:
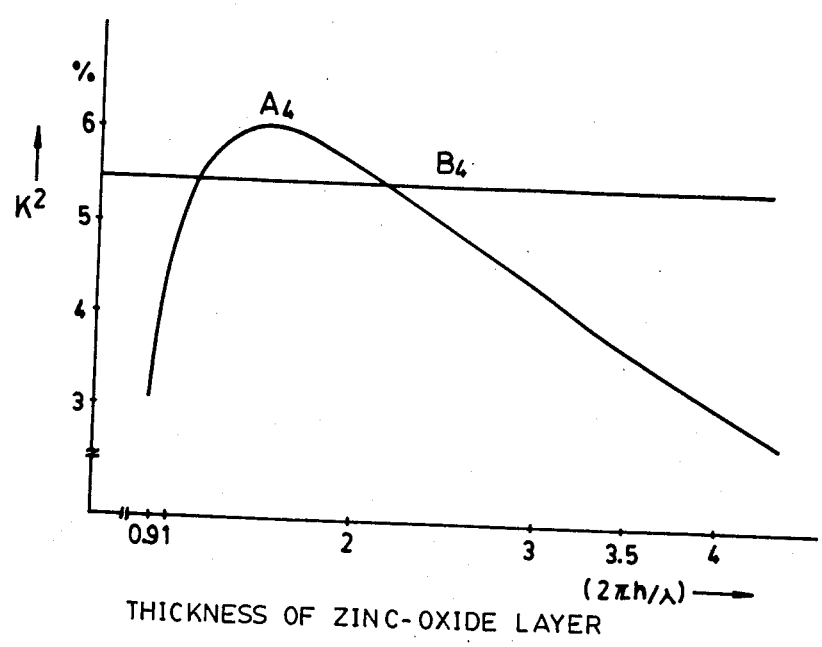
FIGS. 13, 15, 17, 19, 21 and 24 show characteristic diagrams of the embodiments as shown in the drawings introduced immediately before.

FIG. 13 shows the characteristics obtained by the embodiment as shown in FIG. 12. When the electric conductivity near the boundary between the silicon substrate 4A and the zinc oxide layer 5 in FIG. 12 is high, the characteristics vary as shown by the curve $A_4$ in FIG. 13. The curve $A_4$ also relates to Sezawa wave. The straight line $B_4$ shows the maximum value 5.5% of $K^2$ obtained when using a LiNbO$_3$ substrate.

As apparent from the characteristics as shown in FIG. 13, when the surface elastic wave is propagated to the [001]-axis direction of the silicon, electromechanical coupling coefficient large enough to realize high efficiency of the element can be obtained by determining the thickness h of the zinc oxide layer 5 to satisfy the relation $0.9 < 2\pi h/\lambda < 3.5$.

Figure 14:
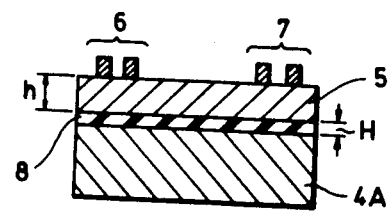

FIG. 14 shows a further embodiment according to the present invention wherein there is formed a dielectric layer 8 of silicon dioxide, for example, on the (100)-oriented silicon substrate 4A by oxidizing the silicon substrate.

Figure 15:
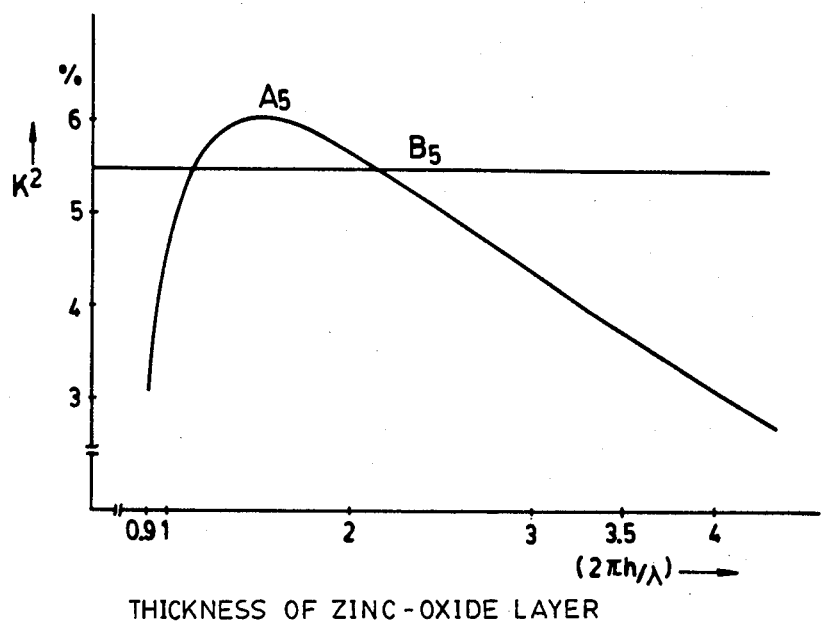

When exciting Sezawa wave, kind of surface elastic waves, through the input electrode 6 of the SEW element as arranged above to the [011]-axis direction of the silicon, the characteristics as shown in FIG. 15 were obtained. When the electric conductivity on the surface of the silicon substrate 4A is high and the thickness H of the dielectric layer 8 is small as compared with the thickness h of the zinc oxide layer 5 in FIG. 14, the characteristics vary as shown by the curve $A_5$ in FIG. 15. The curve $A_5$ also relates to Sezawa wave. The straight line $B_5$ shows the maximum value of $K^2$ obtained when using a LiNbO$_3$ substrate.

As apparent from the characterisitcs in FIG. 15, when propagating the surface elastic wave to the [011]-axis direction of the silicon, electromechanical coupling coefficient high enough to realize high efficiency of the element can be obtained by determining the thickness h of the zinc oxide layer 5 to satisfy the relation $0.9 < 2\pi h/\lambda < 3.5$.

Figure 16:
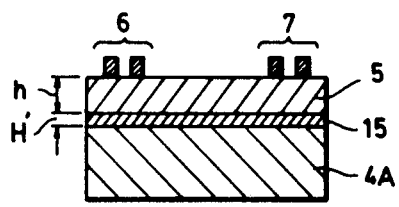

FIG. 16 shows a further embodiment according to the present invention wherein a metallic layer 15 is formed on the (100)-oriented silicon substrate 4A.

Figure 17:
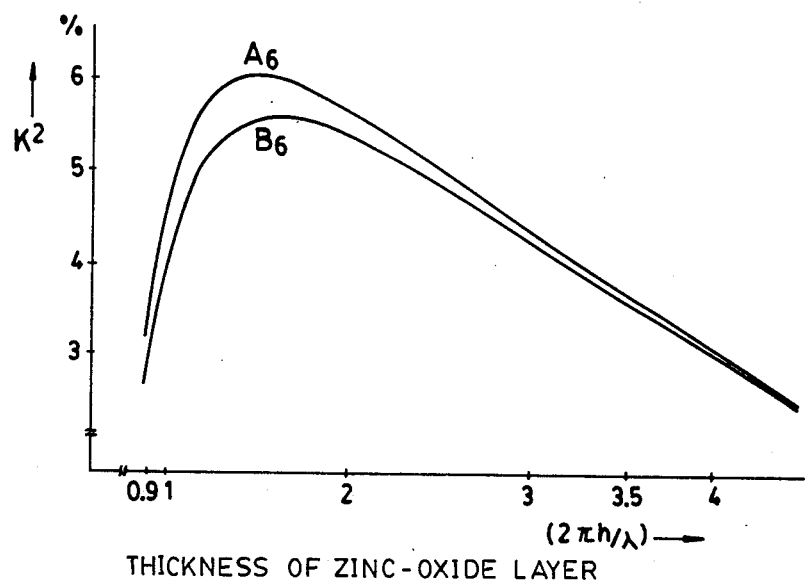

When exciting Sezawa wave, through the input electrode 6 of the SEW element as constructed above, to the [011]-axis direction of the silicon, the characteristics as shown in FIG. 17 were obtained. When the thickness H' of the metallic layer 15 is sufficiently small as compared with the wavelength of the surface elastic wave in the embodiment in FIG. 16, the characteristics vary as shown by the curve $A_6$ in FIG. 17. The curve $A_6$ also relates to Sezawa wave.

The curve $B_6$ shows the $K^2$ characteristics obtained when using a (100)-oriented silicon substrate and exciting Sezawa wave to the [001]-axis direction.

As apparent from the characteristics as shown in FIG. 17, when propagating the surface elastic wave to the [011]-axis direction of the silicon, high electromechanical coupling coefficient large enough to realize high efficiency of the element can be obtained by determining the thickness h of the zinc oxide layer 5 to satisfy the relation $0.9 < 2\pi h/\lambda < 3.5$.

Figure 18:
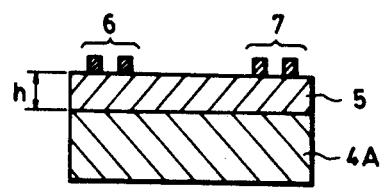

FIG. 18 shows a further embodiment according to the present invention wherein a zinc oxide layer 5 is grown on the (100)-oriented silicon substrate 4A and comb electrodes 6 and 7 are provided on the zinc oxide layer 5.

Figure 19:
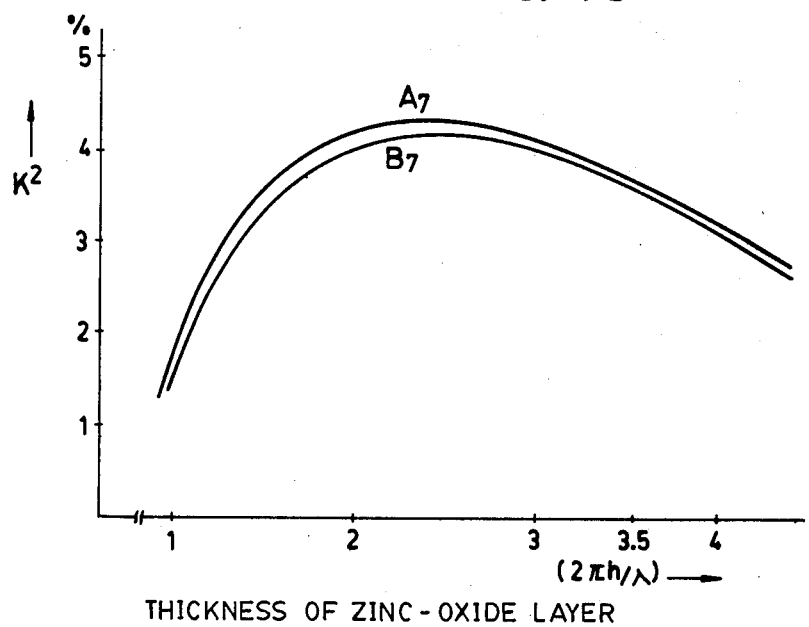

When exciting Sezawa wave, kind of surface elastic waves, to the [011]-axis direction of the silicon, through the input electrode 6 of the SEW element as constructed above, the characteristics as shown in FIG. 19 were obtained. The value of $K^2$ varies as shown by the curve $A_7$ in response to the thickness of the zinc oxide layer 5. The curve $A_7$ also relates to Sezawa wave.

The curve $B_7$ shows the $K^2$ characteristics obtained when using a (100)-oriented silicon substrate and exciting Sezawa wave to the [001]-axis direction of the silicon.

As apparent from the characteristics as shown in FIG. 19, when propagating the surface elastic wave to the [011]-axis direction of the silicon, electromechanical coupling coefficient large enough to realize high efficiency of the element can be obtained by determining the thickness h of the zinc oxide layer 5 to satisfy the relation $1.0 < 2\pi h/\lambda < 3.5$.

Figure 20:
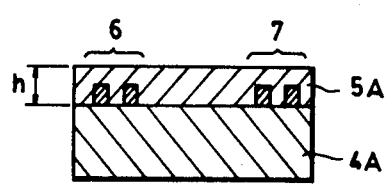

FIG. 20 shows a further embodiment according to the present invention wherein the comb electrodes 6 and 7 are provided on the (100)-oriented silicon substrate and a zinc oxide layer 5A is grown on the silicon substrate 4 so as to entirely cover the electrodes 6 and 7.

Figure 21:
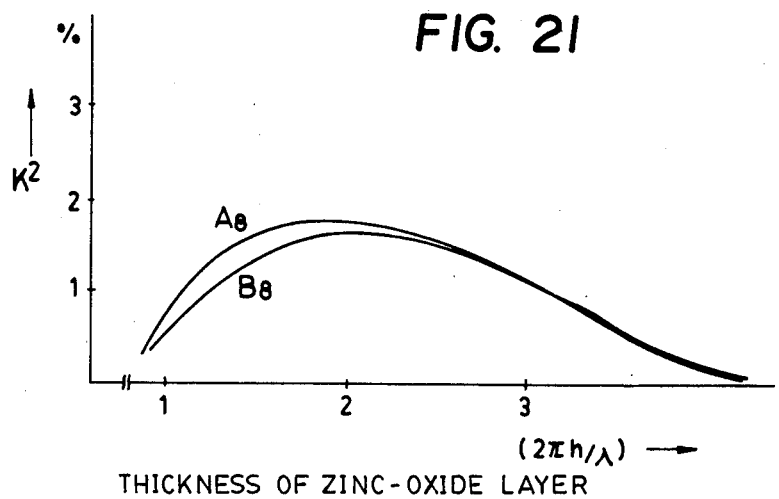

When exciting Sezawa wave, kind of surface elastic waves, to the [011]-axis direction of the silicon, through the input electrode 6 of the SEW element as constructed above, the characteristics as shown in FIG. 21 were obtained. The value of $K^2$ varies as shown by the curve $A_8$ in response to the thickness h of the zinc oxide layer 5A. The curve $A_8$ also relates to Sezawa wave.

The curve $B_8$ shows the $K^2$ characteristics obtained when using a (100)-oriented silicon substrate and exciting Sezawa wave to the [001]-axis direction of the silicon.

As apparent from the characteristics as shown in FIG. 21, when propagating the surface elastic wave to the [011]-axis direction of the silicon, electromechanical coupling coefficient large enough to realize high efficiency of the element can be obtained by determining the thickness h of the zinc oxide layer 5A to satisfy the relation $1.0 < 2\pi h/\lambda < 3.0$.

Figure 22:
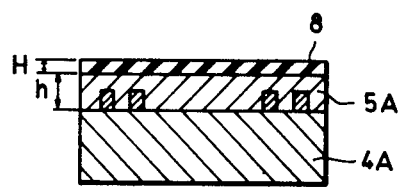

FIG. 22 shows a further embodiment according to the present invention wherein a dielectric layer 8 of silicon dioxide, for example, is grown on the surface of the zinc oxide layer 5A as shown in FIG. 20.

Figure 23:
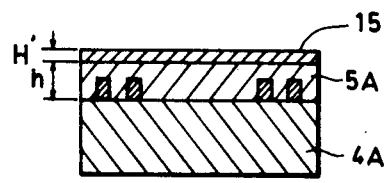

FIG. 23 shows a further embodiment according to the present invention wherein a metallic layer 15 is further formed on the zinc oxide layer 5A on the (100)-oriented silicon substrate 4A.

Figure 24:
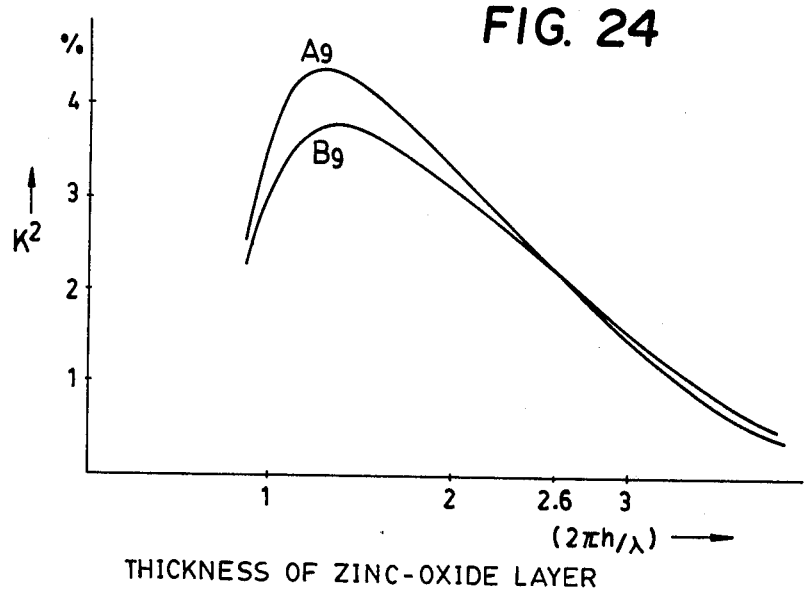

When exciting Sezawa wave, through the input electrode 6 of the SEW element as constructed above, to the [011]-axis direction of the silicon, characteristics as shown in FIG. 24 were obtained. When the thickness H' of the metallic layer 15 in FIG. 23 is sufficiently small as compared with the wavelength of the surface elastic wave, the value of $K^2$ varies as shown by the curve $A_9$ in response to the thickness h of the zinc oxide layer 5A. The curve $A_9$ also relates to Sezawa wave.

The curve B9 shows the $K^2$ characteristics obtained when using a (100)-oriented silicon substrate and exciting Sezawa wave to the [011]-axis direction.

As apparent from the characteristics as shown in FIG. 24, when propagating the surface elastic wave to the [011]-axis direction of the silicon, electromechanical coupling coefficient large enough to realize high efficiency of the element can be obtained by determining the thickness h of the zinc oxide layer 5A to satisfy the relation $1.0 < 2\pi h/\lambda < 2.6$.

In the above-cited embodiments, the piezoelectric axis of the zinc oxide layer 5 or 5A is positioned perpendicularly of the silicon substrate 4 or 4A. However, it has been found that substantially the same characteristics can be obtained even when the piezoelectric axis inclines from the vertical line with respect to the substrate surface within 10 degrees, and, even if the cutting surface of the silicon substrate 4 and the propagation axis for exciting the surface elastic wave are in deviation of several degrees from the (110)-surface and [001]-axis, respectively.

Further, it is expected to realize high efficiency of the element even if the electric conductivity at the boundary between the silicon substrate and the zinc oxide layer is not so high or even if electric potential generated within the silicon substrate and the zinc oxide layer is utilized instead of providing the comb electrodes.

As apparent from the above-made description, according to the present invention, by using a (110)- or (100)-oriented silicon substrate, growing a piezoelectric layer comprising a zinc oxide layer on the substrate and interposing a dielectric layer between the substrate and the piezoelectric layer if necessary, it is possible to flexibly determine electromechanical coupling coefficient at a desired value. Therefore, when adopting the element in a filter comprising comb electrodes, it is possible to obtain a SEW element with high efficiency maintaining various advantages, namely, realization of wide-band characteristics, easy matching, reduction of insertion loss, reduction of the number of teeth of comb electrodes, miniaturization of the element, reduction of production cost, etc.

Particularly, the present invention is effective because it makes it possible to obtain a miniaturized and highly concentrated element by commonly using a substrate for IC circuit as the silicon substrate.

Figure 5:
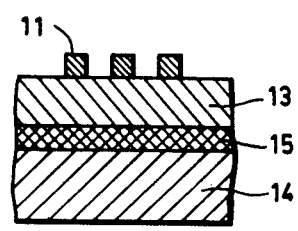
FIG. 5 shows a sectional view illustrating a further embodiment of the element according to the present invention.
Figure 6:
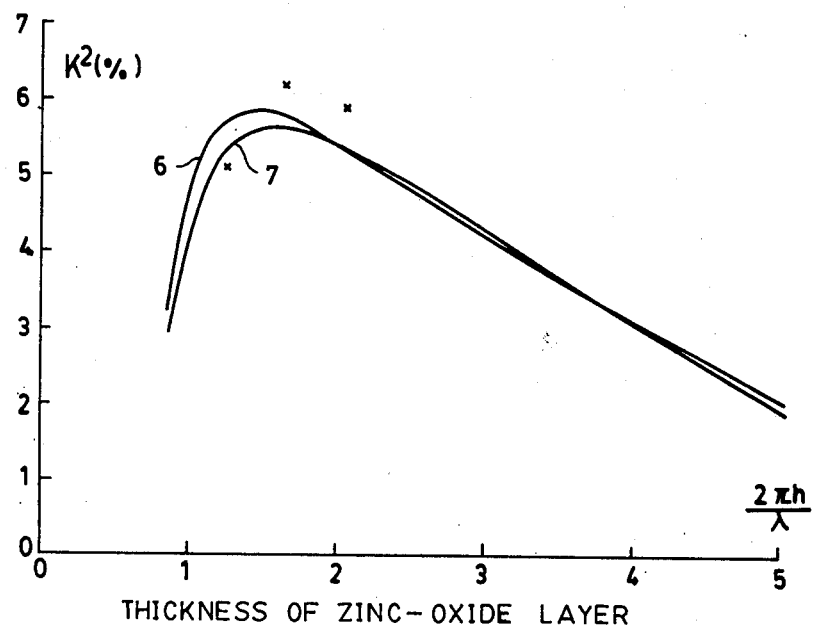
FIG. 6 shows a characteristic diagram of the embodiment as shown in FIG. 5.

FIG. 5 shows another embodiment according to the present invention wherein a substrate 14 made of silicon is coated by a metallic layer 15 with the thickness $h_1$. The substrate 14 is further coated by a zinc oxide layer 13 with the thickness h. A comb electrode 11 is then formed on the zinc oxide layer 13 to excite and propagate the surface elastic wave. In this case, (110)-oriented silicon is used as the substrate 14 and Sezawa wave is adapted as surface elastic wave. With this arrangement of the SEW element as shown in FIG. 5, when the thickness $h_1$ of the metallic layer 15 is sufficiently small as compared with the wavelength of the surface elastic wave, the relation between the square value $K^2$ of the electric machine coupling coefficient K and the thickness h of the zinc oxide layer 13 is expressed by the curve 16 as shown in FIG. 6. The curve 16 is that of Sezawa wave which is excited and propagated along the surface of the silicon substrate 14 to the [001]-axis direction, that is, toward the bottom surface. In FIG. 6, the ordinate represents the square value $K^2$ of the electromechanical coupling coefficient K in percentage while the abscissa represents the value obtained by substituting the thickness h of the zinc oxide layer 13 in the formula $2\pi h/\lambda$. Incidentally, the unit is an absolute number. The curve 17 in FIG. 6 shows the relation between the square value of the electromechanical coupling coefficient K and the thickness h of the zinc oxide layer obtained when using the (100)-oriented silicon substrate 14 as shown in FIG. 5 and exciting and propagating Sezawa wave to the [010]-axis direction.

On the (110)-oriented silicon substrate 14, a metallic layer 15 of aluminum is formed by the RF (high frequency) sputtering method. Later, the zinc oxide layer 13 which is 4–11 μm thick and c axis-oriented is formed on the metallic layer 15 by the DC (direct current) sputtering method. Then, a pattern for the comb electrode 11 to serve as an input electrode is formed on the zinc oxide layer 13 by the photo etching method. In this case, each tooth of the comb electrode 11 is 3–13.5 μm wide and the electrode pitch is 12–54 μm. Using the substrate 14 made by silicon under these conditions, an experiment to excite and propagate the surface elastic wave to the [001]-axis direction i.e. toward the bottom surface was performed. The marks X in FIG. 6 show the values obtained by this experiment and these are near the theoretical values.

As apparent from FIG. 5, the surface elastic wave element according to this embodiment comprises laminations of the metallic layer 15 of aluminum, the zinc oxide layer 13, etc. to permit free selection of the electromechanical coupling coefficient K by adequately adjusting the thickness h of the zinc oxide layer 13, etc.

Owing to the metallic layer 15 of aluminum, the electromechanical coupling coefficient K can be freely selected even when the specific resistance of the silicon substrate 14 is large, resulting in reduction of attenuation of the surface elastic wave caused by electric sound effect.

As apparent from FIG. 6, when using the silicon substrate 14 and exciting and propagating the surface elastic wave to the [001]-axis direction i.e. toward the bottom surface, the electromechanical coupling coefficient K can be made large by determining the thickness h the zinc oxide layer 13 to satisfy the relation $0.9 < 2\pi h/\lambda < 3.5$.

In the above embodiment, the piezoelectric axis of the zinc oxide layer 13 is perpendicular with respect to the bottom surface of the silicon substrate 14. However, if the tilt angle of the piezoelectric axis with respect to the bottom surface of the silicon substrate 14 is between 80–110 degrees, characteristics of the SEW element do not substantially vary.

Further, although the surface elastic wave is excited and propagated to the [001]-axis direction i.e. toward the bottom surface along the silicon substrate 14, the wave may be excited and propagated to other directions.

The comb electrode 11 may be replaced with electrodes of other types. When adopting the comb electrode 11, it is necessary to position it just above the aluminum layer 15 formed on the silicon substrate 14. It is evidently possible to realize an element with high efficiency even when utilizing electric potential generated in the silicon substrate 14 and the zinc oxide layer 13 instead of providing the electrode 11.

Because the present embodiment uses the silicon substrate 14, it is possible to commonly use it as an IC substrate.

Further, although the (110)-surface and [001]-axis are selected for cutting the silicon substrate 14 and exciting and propagating the surface elastic wave, respectively, substantial variations of the characteristics do not occur even if these surface and axis slightly deviate.

By varying the cutting surface of the silicon substrate, propagation direction, thickness of layers, etc. still larger electromechanical coupling coefficient can be obtained.

Figure 25:
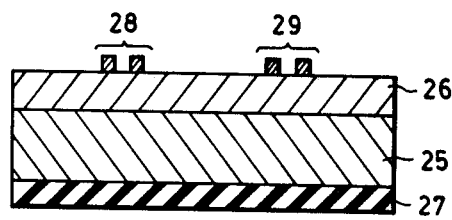
FIGS. 25, 27, 29, 30 and 31 show sectional views illustrating further embodiments according to the present invention.

FIG. 25 shows a sectional view of a further embodiment of the SEW element according to the present invention wherein the reference numeral 27 designates an elastic element made of silicon dioxide or sapphire, for example. The numeral 25 refers to a (110)-oriented silicon layer coating the elastic element 27, 26 to a zinc oxide layer so formed that the piezoelectric axis thereof is perpendicular of the surface of the silicon layer 25 and 28 and 29 to comb electrodes provided on the zinc oxide layer 26.

The zinc oxide layer 26 may be formed by the known sputtering method, CVD method and the like and the comb electrodes 28 and 29 may be formed by depositing metal like aluminum, etc. by a well-known deposition method.

When Sezawa wave, kind of surface elastic wave is excited, through the input electrode 28 of the SEW element as constructed above, to the [001]-axis direction of the silicon 25, the surface elastic wave propagates along the zinc oxide layer 26 to reach the output electrode 29.

Figure 26:
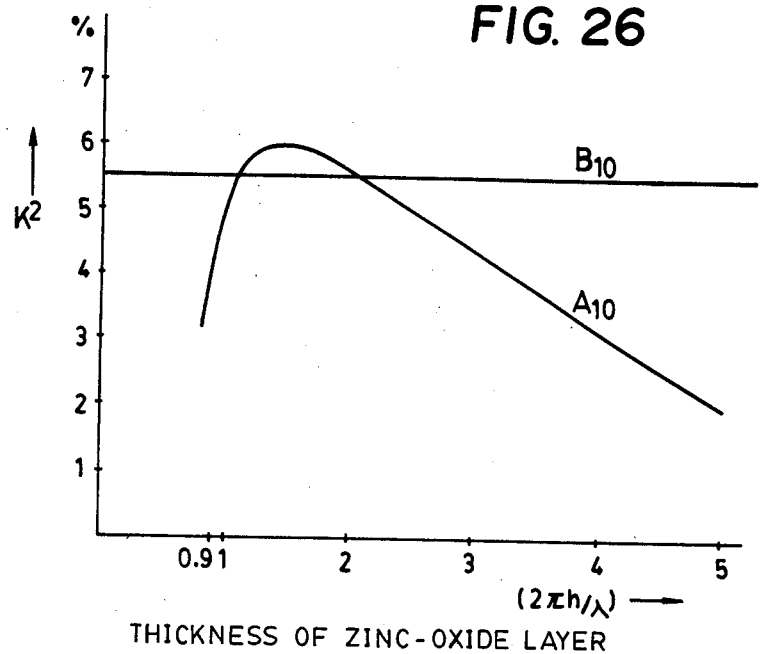
FIGS. 26 and 28 show characteristic diagrams of the embodiments as shown in the drawings introduced immediately before.

FIG. 26 shows the characteristics obtained by the embodiment as shown in FIG. 25. When the electric conductivity at the boundary between the silicon layer 25 and the zinc oxide layer 26 is high, the square value $K^2$ of the electromechanical coupling coefficient K varies as shown by the curve $A_{10}$ in FIG. 26. The curve $A_{10}$ relates to Sezawa wave among surface elastic waves.

The straight line $B_{10}$ shows the value of $K^2$ obtained by a lithium niobium oxide (LiNbO$_3$) substrate to reach about 5.5%.

As apparent from the characteristics as shown in FIG. 26, when propagating the surface elastic wave to the [001]-axis direction, electromechanical coupling coefficient large enough to realize high efficiency of the element can be obtained by determining the thickness of the zinc oxide layer 26 to satisfy the relation $0.9 < 2\pi h/\lambda < 3.0$.

Figure 27:
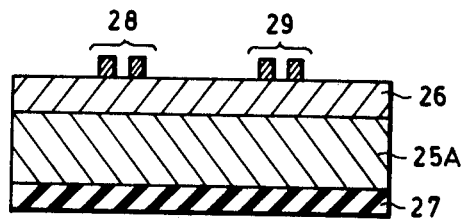

FIG. 27 shows a sectional view of a SEW element as a further embodiment according to the present invention wherein the reference numeral 25A designates a (100)-oriented silicon substrate and the other structure is same as the element as shown in FIG. 25.

With respect to the input electrode 28 of the SEW element as constructed above, Sezawa wave is excited to the [011]-axis direction.

Figure 28:
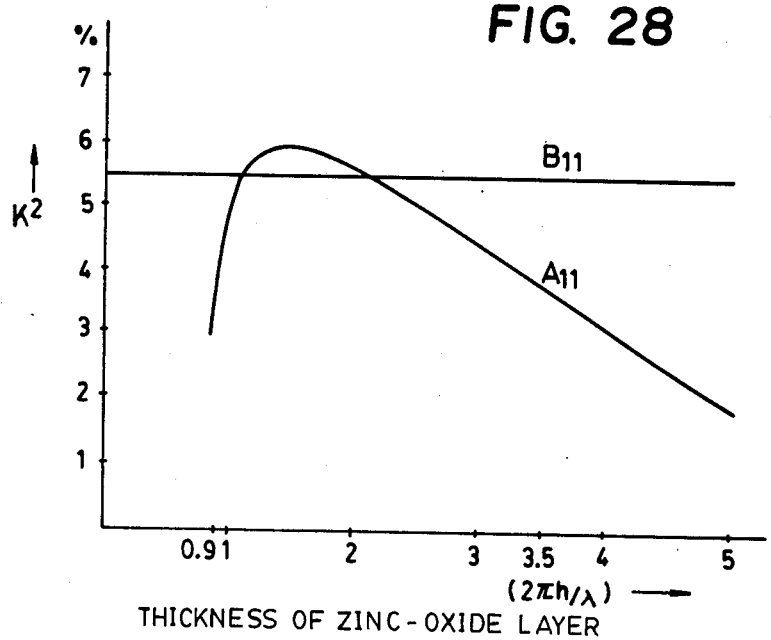

FIG. 28 shows the characteristics obtained by the element in FIG. 28 wherein when the electric conductivity at the boundary between the silicon substrate 25A and the zinc oxide layer 26 is high, the square value $K^2$ of the electromechanical coupling coefficient K varies as shown by the curve $A_{11}$. The curve $A_{11}$ relates to Sezawa wave.

The straight line $B_{11}$ shows the maximum value of $K^2$ obtained by a lithium niobium oxide (LiNbO$_3$) substrate to reach about 5.5%.

As apparent from the characteristics of FIG. 28, when propagating the surface elastic wave to the [011]-axis direction of the silicon 25A, electromechanical coupling coefficient large enough to realize high efficiency of the element can be obtained by determining the thickness h of the zinc oxide layer 25 to satisfy the relation $0.9 < 2\pi h/\lambda < 3.5$.

When particularly using sapphire as the elastic element 27 in the embodiments as shown in FIG. 25 and FIG. 27, it is possible to easily permit epitaxial growth of the single crystalline silicon layer 25 on the sapphire in an SOS (silicon on sapphire) manner. The SOS substrate produced as above enables fabrication of the SEW element and the semiconductive element on the same substrate and in the same process.

Figure 29:
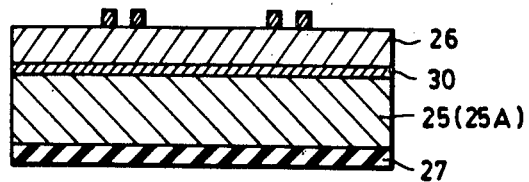

As described above, high electric conductivity at the boundary between the silicon substrate 25 and the zinc oxide layer 26 means that the same effect can be obtained even when a metallic layer 30 is formed at the boundary as shown in FIG. 29. Further, because the bulk resistance can be reduced even when the silicon layer 25 comprises an epitaxial growth layer, the same effect can be obtained.

When using silicon dioxide as the elastic element 27, the silicon dioxide functions to cancel the temperature coefficient of the element determined by the silicon layer 25 and the zinc oxide layer 26, thus permitting the element to have a small temperature coefficient as a whole. Therefore, delay time temperature coefficient can be reduced.

Figure 30:
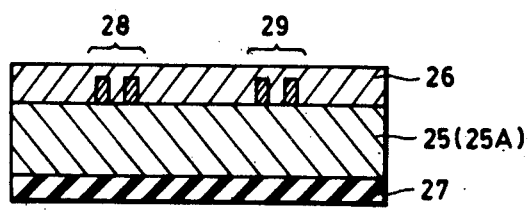

The comb electrodes 28 and 29 may be provided on the silicon layer 25 as shown in the embodiment of FIG. 30. It is also possible to select such a structure as shown in FIG. 31 wherein a metallic layer 30 is adhered on the zinc oxide layer 26 covering the comb electrodes 28 and 29.

Figure 31:
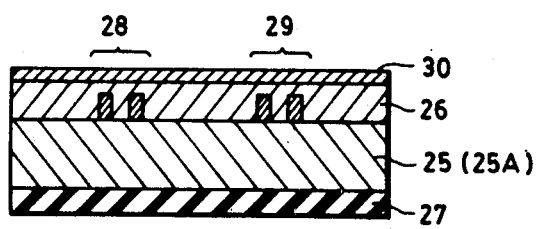

In the embodiments as shown in FIG. 30 and 31, silicon dioxide may be provided in order to protect the silicon layer 25.

In the above-cited embodiments, the piezoelectric axis of the zinc oxide layer 26 is positioned perpendicularly of the silicon layer 25. However, substantially same characteristics can be obtained even when the piezoelectric axis deviates from the vertical line with respect to the substrate surface within 10 degrees, and, even if the crystalline surface of the silicon layer 25 and the propagating axis for exciting the surface elastic wave are in deviation of several degrees from the (110)-surface and [001]-axis, respectively.

As apparent from the above-made description, according to those embodiments of the present invention, by providing a silicon layer with a predetermined crystalline orientation in contact with an elastic element, growing a zinc oxide layer on the silicon layer and providing electrodes in contact with the zinc oxide layer, it is possible to flexibly determine electromechanical coupling coefficient at a desired value. The possibility of determining the electromechanical coupling coefficient permits reduction of impedance of a SEW transducer, easy matching and realization of a SEW element with high efficiency. At the same time, because the number of the electrode members of the SEW transducer can be reduced, it is possible to miniaturize the element and reduce the production cost.

Further, the temperature coefficient can be made small by providing an elastic element, resulting in stable function of the SEW element.

Figure 32:
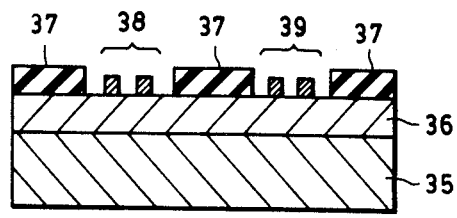
FIGS. 32, 34, 36 and 37 show sectional views illustrating further embodiments according to the present invention.

FIG. 32 shows a sectional view illustrating a further embodiment of the SEW element according to the present invention wherein the reference numeral 35 designates a (110)-oriented silicon substrate. The numeral 36 refers to a zinc oxide layer so formed that the piezoelectric axis thereof is positioned perpendicularly to the surface of the silicon substrate 35, 37 to a dielectric layer of silicon dioxide, for example, partially grown on the surface of the zinc oxide layer 36 and 38 and 39 to comb electrodes formed within the same level as the dielectric layer 37 and on the zinc oxide layer 36 which is not coated by the dielectric layer 37.

With respect to the input electrode 38 of the SEW element as constructed above, Sezawa wave, kind of surface elastic wave, is excited to the [001]-axis direction of the silicon 35. The surface elastic wave then propagating along the surface of the zinc oxide layer 36 to reach the output electrode 39.

Figure 33:
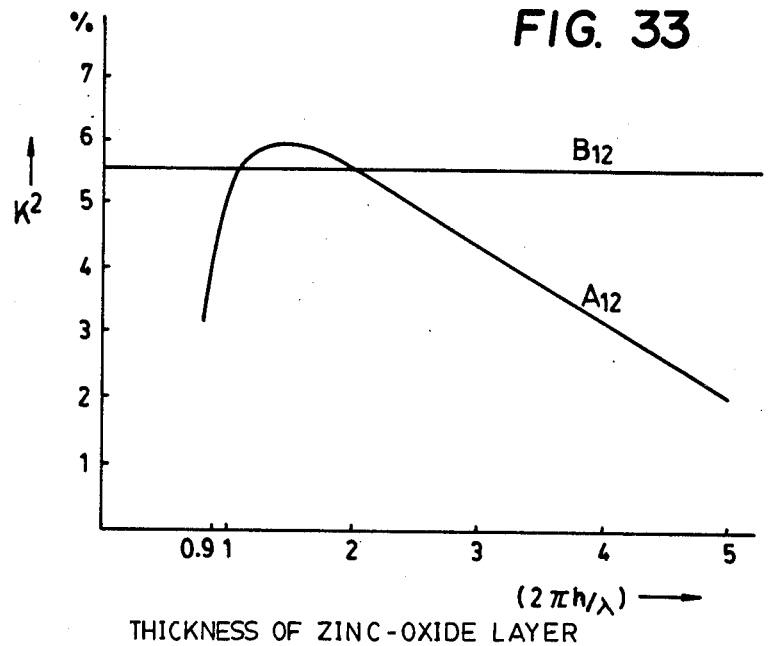
FIGS. 33 and 35 show characteristic diagrams of the embodiments as shown in FIGS. 32, 34, 36 and 37.

FIG. 33 shows the characteristics obtained by the embodiment as shown in FIG. 32, wherein when the electric conductivity at the boundary between the silicon substrate 35 and the zinc oxide layer 36 is high, the square value $K^2$ of the electromechanical coupling coefficient K varies as shown by the curve $A_{12}$ in FIG. 33. The curve $A_{12}$ relates to Sezawa wave among surface elastic waves.

The straight line $B_{12}$ shows the maximum value of $K^2$ obtained by a lithium niobium oxide (LiNbO$_3$) substrate to reach about 5.5%.

As apparent from the characteristics of FIG. 33, when propagating the surface elastic wave to the [001]-axis direction of the silicon 35, electromechanical coupling coefficient large enough to realize high efficiency of the element can be obtained by determining the thickness h of the zinc oxide layer 36 to satisfy the relation $0.9 < 2\pi h/\lambda < 3.0$.

Figure 34:
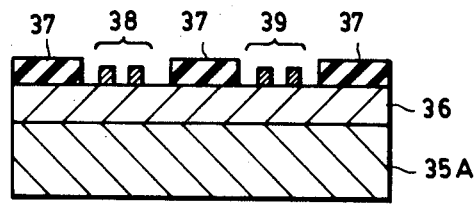

FIG. 34 shows a sectional view illustrating a further embodiment according to the present invention wherein the reference numeral 35A designates a (100)-oriented silicon substrate and the other numerals refer to the same parts as those in FIG. 32.

With respect to the input electrode 38 of the SEW element as arranged above, Sezawa wave, kind of surface elastic wave is excited to the [011]-axis direction of the silicon 35A.

Figure 35:
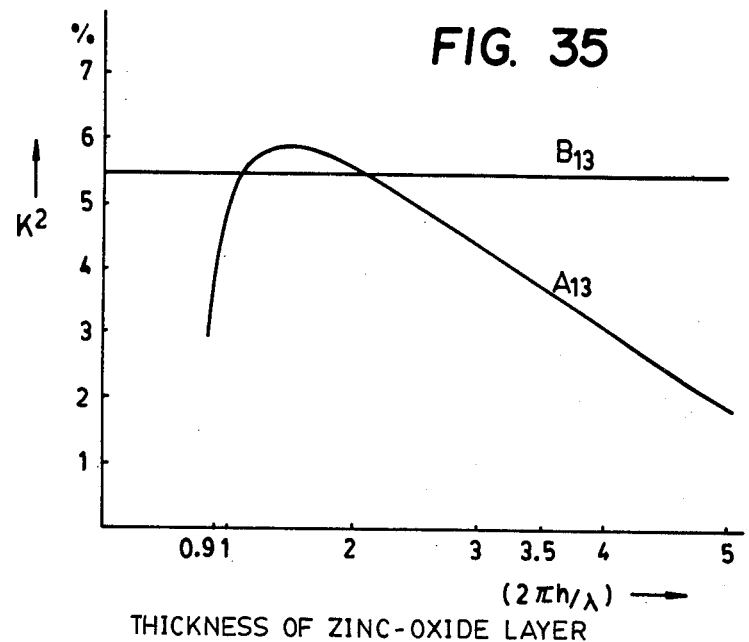

FIG. 35 shows the characterisitcs obtained by the embodiment as shown in FIG. 34 wherein when the electric conductivity at the boundary between the silicon substrate 35 and the zinc oxide layer 36 is high, the square value $K^2$ of the electromechanical coupling coefficient K varies as shown by the curve $A_{13}$. The curve $A_{13}$ relates to Sezawa wave among surface elastic waves.

The straight line $B_{13}$ shows the maximum value of $K^2$ obtained by a lithium niobium oxide (LiNbO$_3$) substrate to reach about 5.5%.

As apparent from the characteristics of FIG. 35, when propagating the surface elastic wave to the [011]-axis direction of the silicon 35A, electromechanical coupling coefficient large enough to realize high efficiency of the element can be obtained by determining the thickness h of the zinc oxide layer 36 to satisfy the relation $0.9 < 2\pi h/\lambda < 3.5$.

Figure 36:
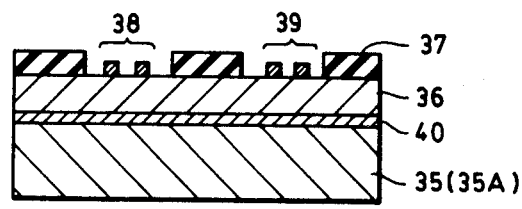

High electric conductivity at the boundary between the silicon substrate 35 and the zinc oxide layer 36, as described above, means that the same effect can be obtained even if a metallic layer 40 is formed at the boundary as shown in FIG. 36.

Further, because the bulk resistance can be reduced even when the silicon substrate 35 comprises epitaxial growth layer, the same effect as that of FIG. 32 can be obtained.

Figure 37:
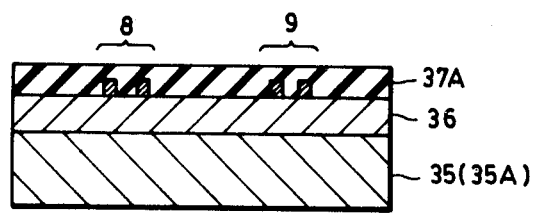

FIG. 37 shows a further embodiment according to the present invention wherein a dielectric layer 37A of silicondioxide, etc. with sufficiently small thickness as compared with the wavelength of the surface elastic wave is flatly grown so as to entirely cover the comb electrodes 38 and 39 throughout the zinc oxide layer 36. With this structure also, the same effect as in FIGS. 32 and 36 can be obtained.

Silicon dioxide forming the dielectric layer 37 functions to cancel the temperature coefficient of the element determined by the silicon substrate 35 and the zinc oxide layer 36, thus permitting the element to have small temperature coefficient as a whole.

The comb electrodes may be provided on the silicon substrate and a metallic layer may be adhered on the zinc oxide layer covering the comb electrodes.

In the embodiments introduced above, the piezoelectric axis of the zinc oxide layer 36 is positioned perpendicularly to the silicon substrate 35. However, even if the piezoelectric axis inclines from the vertical line with respect to the substrate 35 within 10 degrees, substantially the same characteristics can be obtained. Further, even if the orientation of the silicon substrate 35 and the propagation axis for exciting the (110)- or (100)-surface and [001]- or [011]-axis, respectively, substantially same characteristics can be obtained.

Figure 38:
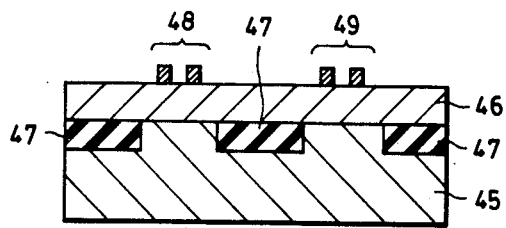
FIGS. 38, 40, 42 and 43 show sectional views illustrating further embodiments according to the present invention.

FIG. 38 shows a sectional view illustrating a SEW element as an embodiment according to the present invention wherein the reference numeral 45 designates a (110)-oriented silicon substrate. The numeral 47 refers to a dielectric layer of silicon dioxide, for example, partially grown on the silicon substrate 45, 46 to a zinc oxide layer so formed that the piezoelectric axis thereof is positioned perpendicularly to the silicon substrate 45 and the dielectric layer 47 and 48 and 49 to comb electrodes provided on the zinc oxide layer 46.

Through the input electrode 48 of the SEW element as constructed above, Sezawa wave, kind of surface elastic wave, is excited to the [001]-axis direction of the silicon 45 to propagate along the surface of the zinc oxide layer 46 to reach the output electrode 49.

Figure 39:
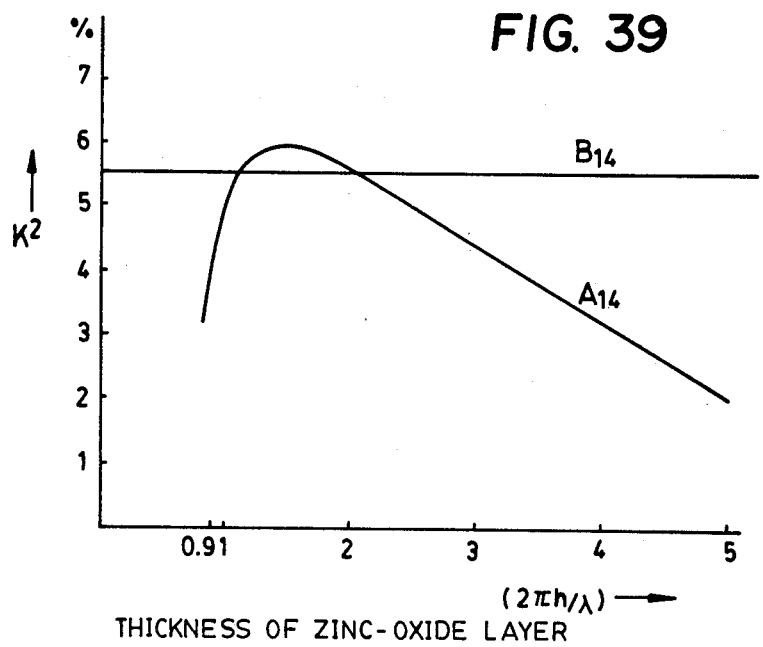
FIGS. 39 and 41 show characteristic diagrams of the embodiments as shown in FIGS. 38, 40, 42 and 43.

FIG. 39 shows the characteristics obtained by the embodiment in FIG. 38 wherein when the electric conductivity at the boundary between the silicon substrate 45 and the zinc oxide layer 46 is high, the square value $K^2$ of the electromechanical coupling coefficient K varies as shown by the curve $A_{14}$. The curve $A_{14}$ relates to Sezawa wave among surface elastic waves.

The straight line $B_{14}$ shows the maximum value of $K^2$ obtained by a lithium niobium oxide (LiNbO$_3$) substrate to reach about 5.5%.

As apparent from the characteristics in FIG. 39, when propagating the surface elastic wave to the [001]-axis direction, electromechanical coupling coefficient large enough to realize high efficiency of the element can be obtained by determining the thickness h of the zinc oxide layer 46 to satisfy the relation $0.9 < 2\pi h/\lambda < 3.0$.

Figure 40:
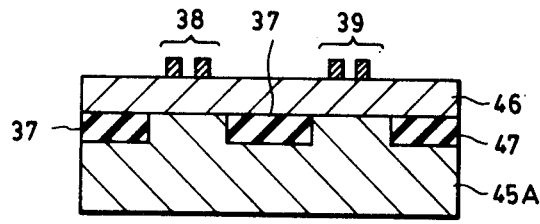

FIG. 40 shows a sectional view illustrating a SEW element as a further embodiment according to the present invention wherein the reference numeral 45A designates a (100)-oriented silicon substrate and the other numerals refer to the same parts as in FIG. 38.

With respect to the input electrode 48 of the SEW element as constructed above, Sezawa wave, kind of surface elastic wave, is excited to the [011]-axis direction of the silicon 45A.

Figure 41:
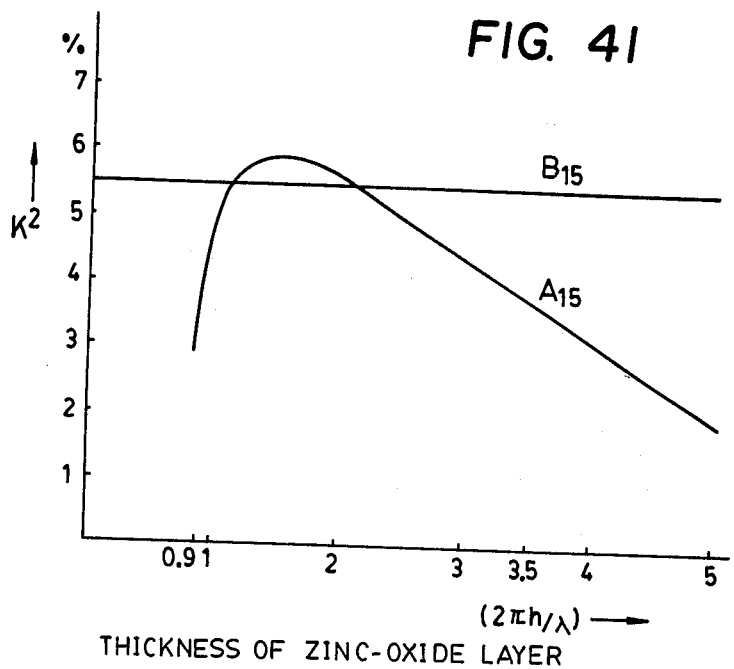

FIG. 41 shows the characteristics obtained by the embodiment of FIG. 40 wherein when the electric conductivity at the boundary between the silicon substrate 45 and the zinc oxide layer 46 is high, the square value $K^2$ of the electromechanical coupling coefficient K varies as shown by the curve $A_{15}$. The curve $A_{15}$ relates to Sezawa wave among surface elastic waves.

The straight line $B_{15}$ shows the maximum value of $K^2$ obtained by a lithium niobium oxide (LiNbO₃) substrate to reach about 5.5%.

As apparent from the characteristics of FIG. 41, when propagating the surface elastic wave to the [011]-axis direction of the silicon 45A, electromechanical coupling coefficient large enough to realize high efficiency of the element can be obtained by determining the thickness h of the zinc oxide layer 46 to satisfy the relation $0.9 < 2\pi h/\lambda < 3.5$.

Figure 42:
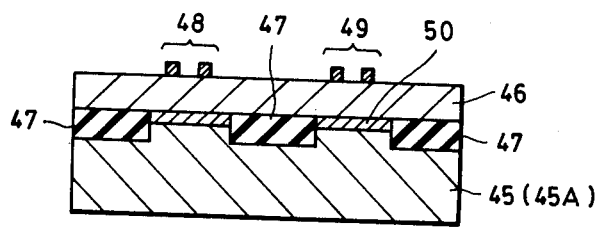

High electric conductivity at the boundary between the silicon substrate 45 and the zinc oxide layer 46 means the possibility of performing the same effect even if a metallic layer 50 is formed at the boundary as shown in FIG. 42.

Further, because the bulk resistance can be reduced even when the silicon substrate 45 comprises epitaxial growth layer, the same effect as in the embodiment of FIG. 38 can be obtained.

Figure 43:
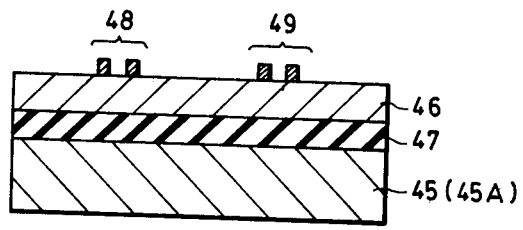

FIG. 43 shows a further embodiment according to the present invention wherein a dielectric layer 47 of silicon dioxide, etc. with a sufficiently small thickness as compared with the wavelength of the surface elastic wave is grown throughout the silicon 45 (45A). This structure also gives the same effect as in the embodiments of FIG. 38 and FIG. 40.

Because silicon dioxide constructing the dielectric layer 47 functions to cancel the temperature coefficient of the element determined by the silicon substrate 45 and the zinc oxide layer 46, the element is permitted to have a small temperature coefficient as a whole.

The comb electrodes may be provided on the silicon substrate or on the dielectric layer and a metallic layer may be adhered on the zinc oxide layer covering the comb electrodes.

In the above-introduced embodiments, the piezoelectric axis of the zinc oxide layer 46 is positioned perpendicularly to the silicon substrate 45 or 45A. However, substantially same characteristics can be obtained even if the piezoelectric axis inclines from the vertical line with respect to the substrate 45 within approximately 10 degree. Further, it is found that substantially same characteristics can be obtained even when the orientation of the silicon substrate 45 and the propagation axis for exciting the surface elastic wave are in deviation of several degree from the (110)- or (100)-surface and [001]- or [011]-axis, respectively.

We claim:

1. A surface elastic wave element which comprises:
a (110)-oriented silicon substrate;
a zinc oxide layer grown on said substrate; and
electrodes formed on said zinc oxide layer.

2. A surface elastic wave element which comprises:
a (110)-oriented silicon substrate;
electrodes formed on said substrate; and
a zinc oxide layer grown on said electrodes and silicon substrate.

3. A surface elastic wave element which comprises:
a (100)-oriented silicon substrate;
a zinc oxide layer grown on said silicon substrate; and
electrodes formed on said zinc oxide layer.

4. A surface elastic wave element which comprises:
a (100)-oriented silicon substrate;
electrodes formed on said substrate; and
a zinc oxide layer grown on said electrodes and silicon substrate.

5. A surface elastic wave element which comprises:
a (110)-oriented silicon substrate;
a metallic layer formed at least on a part of said substrate;
a zinc oxide layer grown on said metallic layer; and
electrodes formed on said zinc oxide layer.

6. A surface elastic wave element as claimed in claim 2 further comprising a metallic layer formed on said zinc oxide layer.

7. A surface elastic wave element which comprises:
a (110)-oriented silicon substrate;
a dielectric layer formed on said substrate;
a zinc oxide layer formed on said dielectric layer; and
electrodes formed on said zinc oxide layer.

8. A surface elastic wave element as claimed in claim 6 or claim 7 wherein the piezoelectric axis of said zinc oxide layer is perpendicular to the surface of said silicon substrate.

9. A surface elastic wave element as claimed in claim 6 or claim 7 wherein the piezoelectric axis of said zinc oxide layer is inclined at an angle of up to 10 degrees with respect to a line perpendicular to the surface of the silicon substrate.

10. A surface elastic wave element as claimed in claim 1, claim 2, claim 6 or claim 7 wherein said zinc oxide layer has a thickness h with respect to the wavelength λ of the surface elastic wave propagating within said element to satisfy the relation $0.9 < 2\pi h/\lambda < 3.0$.

11. A surface elastic wave element as claimed in claim 3, claim 4, claim 5 or claim 6, wherein said zinc oxide layer has a thickness h with respect to the wavelength λ of the surface elastic wave propagating within said element to satisfy the relation $0.9 < 2\pi h/\lambda < 3.5$.

12. A surface elastic wave element as claimed in claim 1 or claim 7 further comprising a means for providing one of said electrodes with a signal for propagating the surface elastic wave to the [001]-axis direction of said zinc oxide layer.

13. A surface elastic wave element as claimed in claim 2 or claim 6 further comprising a means for providing one of said electrodes with a signal for generating surface elastic wave to propagate to the [001]-axis direction of said silicon substrate.

14. A surface elastic wave element as claimed in claim 3 or claim 4 further comprising a means for providing one of said electrodes with a signal for generating surface elastic wave to propagate to the [011]-axis direction of said silicon substrate.

* * * * *